(12) United States Patent
Kazue et al.

(10) Patent No.: US 10,497,731 B2
(45) Date of Patent: Dec. 3, 2019

(54) PHOTOELECTRIC CONVERSION DEVICE

(71) Applicant: CANON KABUSHIKI KAISHA, Tokyo (JP)

(72) Inventors: Yuichi Kazue, Tokyo (JP); Takahiro Hachisu, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/888,253

(22) Filed: Feb. 5, 2018

(65) Prior Publication Data

US 2018/0233524 A1 Aug. 16, 2018

(30) Foreign Application Priority Data

Feb. 14, 2017 (JP) .................. 2017-024952

(51) Int. Cl.
*H01L 27/146* (2006.01)
*H01L 23/552* (2006.01)

(52) U.S. Cl.
CPC .... *H01L 27/14623* (2013.01); *H01L 27/1462* (2013.01); *H01L 27/14636* (2013.01); *H01L 27/14685* (2013.01); *H01L 23/552* (2013.01); *H01L 27/14621* (2013.01); *H01L 27/14627* (2013.01)

(58) Field of Classification Search
CPC ............... H01L 27/146–14893; H01L 27/14649–14652; H01L 27/14634; H01L 27/14623; H01L 27/14685; H01L 27/14687; H01L 27/1469; H01L 27/14875–14881; H01L 27/14618; H01L 27/1462; H01L 23/552
See application file for complete search history.

(56) References Cited

U.S. PATENT DOCUMENTS

| | | | |
|---|---|---|---|
| 7,633,133 B2 * | 12/2009 | Noma ............... | H01L 27/14618 257/433 |
| 7,687,283 B2 | 3/2010 | Terui | |
| 8,947,566 B2 * | 2/2015 | Kobayashi ........ | H01L 27/14632 257/292 |
| 9,136,420 B2 | 9/2015 | Sakano | |
| 2004/0016983 A1 * | 1/2004 | Misawa ............ | H01L 27/14618 257/433 |
| 2006/0038245 A1 * | 2/2006 | Terui ................... | H01L 23/3114 257/421 |
| 2007/0031988 A1 * | 2/2007 | Agranov ............. | H01L 27/1462 438/60 |
| 2007/0145420 A1 * | 6/2007 | Okada ............... | H01L 27/14618 257/228 |

(Continued)

FOREIGN PATENT DOCUMENTS

| | | |
|---|---|---|
| JP | 5-56916 A | 3/1993 |
| JP | 2003-152131 A | 5/2003 |

(Continued)

*Primary Examiner* — Zandra V Smith
*Assistant Examiner* — Jeremy J Joy
(74) *Attorney, Agent, or Firm* — Venable LLP

(57) ABSTRACT

A photoelectric conversion device includes a semiconductor substrate having a photoelectric conversion unit, a magnetic layer arranged over an opposite side to a light-receiving face of the semiconductor substrate, and an infrared ray absorbing layer arranged between the semiconductor substrate and the magnetic layer.

20 Claims, 8 Drawing Sheets

(56) References Cited

U.S. PATENT DOCUMENTS

| | | | |
|---|---|---|---|
| 2008/0106626 A1* | 5/2008 | Tatani | H01L 27/1462 348/308 |
| 2010/0238331 A1* | 9/2010 | Umebayashi | H01L 27/14632 348/294 |
| 2012/0044444 A1* | 2/2012 | Park | H01L 27/14623 349/106 |
| 2012/0062777 A1* | 3/2012 | Kobayashi | H01L 27/14605 348/302 |
| 2012/0105696 A1* | 5/2012 | Maeda | H01L 21/76898 348/302 |
| 2012/0199930 A1* | 8/2012 | Hayashi | H01L 27/1461 257/435 |
| 2013/0020468 A1* | 1/2013 | Mitsuhashi | H01L 27/14627 250/208.1 |
| 2013/0134541 A1* | 5/2013 | Chang | H01L 27/1462 257/435 |
| 2014/0347538 A1* | 11/2014 | Toda | H01L 27/14603 348/308 |
| 2015/0130003 A1* | 5/2015 | Kim | H01L 27/14638 257/432 |
| 2015/0293283 A1* | 10/2015 | Nara | G02B 1/04 348/340 |
| 2015/0333101 A1 | 11/2015 | Sakano | |
| 2017/0017023 A1* | 1/2017 | Sugiyama | G02B 5/26 |
| 2018/0114807 A1* | 4/2018 | Yamagishi | H01L 27/14 |

FOREIGN PATENT DOCUMENTS

| | | |
|---|---|---|
| JP | 2005-086100 A | 3/2005 |
| JP | 2006-059839 A | 3/2006 |
| JP | 2010-171053 A | 8/2010 |
| JP | 2011-027650 A | 2/2011 |
| JP | 2011-174763 A | 9/2011 |
| JP | 2012-79979 A | 4/2012 |
| JP | 2015-015662 A | 1/2015 |
| JP | 2015-119133 A | 6/2015 |

* cited by examiner

PHOTOELECTRIC CONVERSION DEVICE

BACKGROUND OF THE INVENTION

Field of the Invention

The present invention relates to a photoelectric conversion device having a magnetic layer for reducing electromagnetic noise.

Description of the Related Art

Reduction in size and cost of electronic devices in recent years leads to a demand for reduction in size and cost in a mounting package of semiconductor devices. One of the technologies that can reduce the size and the cost of a mounting package may be wafer level chip size package (WLCSP). The WLCSP is a technology of packaging semiconductor chips in a form of a wafer and then singulating it into respective semiconductor chips. In the general WLCSP, after a semiconductor substrate in which semiconductor elements are formed on a front face is attached to a support substrate and thinned, and through electrodes are formed from the back face of the semiconductor substrate. Thereby, reduction in size and cost of semiconductor chips is realized.

Due to reduction in size of a semiconductor chip and densification of interconnections, however, electromagnetic noise of a semiconductor device has become significant. One reason of occurrence of electromagnetic noise is electromagnetic radiation emitted from an active circuit of the semiconductor element. For example, when a current caused by an active circuit forms a loop within a plane of a semiconductor substrate, a magnetic field perpendicular to the semiconductor substrate occurs. Such electromagnetic radiation emitted from the front face, the side face, or the back face of the semiconductor substrate causes an electromagnetic disturbance such as radio-frequency interference or abnormal resonance.

For example, in a semiconductor device disclosed in Japanese Patent Application Laid-Open No. 2006-059839, a magnetic layer made of ferrite or the like is provided parallel to an interconnection plane on the front face or the back face of a semiconductor substrate singulated from a semiconductor wafer. Thereby, the magnetic field occurring perpendicular to the semiconductor substrate plane is shielded to reduce electromagnetic noise.

In Japanese Patent Application Laid-Open No. 2006-059839, application of a magnetic layer to a photoelectric conversion device is not considered. In considering application to a photoelectric conversion device, it is necessary to provide a magnetic layer on the side opposite to a light-receiving face of the semiconductor substrate having the photoelectric conversion unit. However, there is a concern that an infrared ray that is not absorbed by the photoelectric conversion unit and transmits through the semiconductor substrate is reflected by a magnetic layer used for reducing electromagnetic noise and again absorbed in the photoelectric conversion unit causing an image noise.

SUMMARY OF THE INVENTION

According to one aspect of the present invention, there is provided a photoelectric conversion device includes a semiconductor substrate having a photoelectric conversion unit, a magnetic layer arranged over an opposite side to a light-receiving face of the semiconductor substrate, and an infrared ray absorbing layer arranged between the semiconductor substrate and the magnetic layer.

Further features of the present invention will become apparent from the following description of exemplary embodiments with reference to the attached drawings.

DESCRIPTION OF THE EMBODIMENTS

Figure 1A:
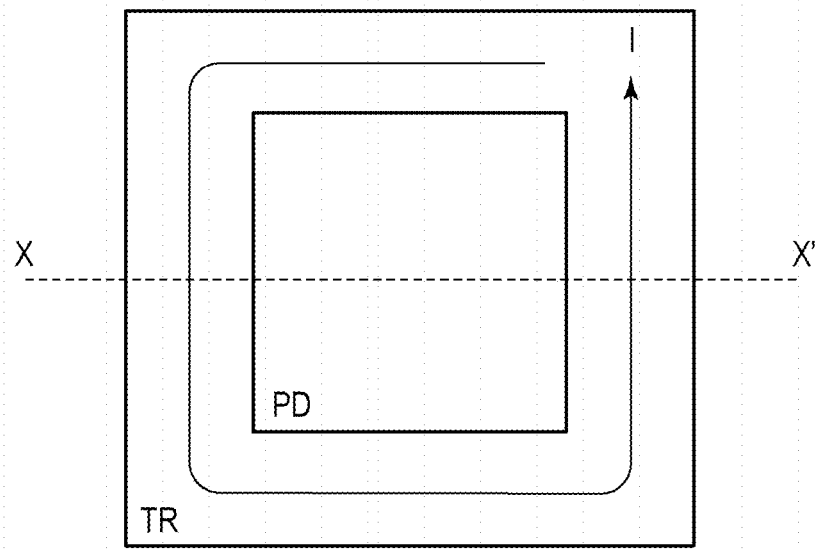
FIG. 1A and FIG. 1B are diagrams illustrating an example of the principle of generation of electromagnetic noise in a photoelectric conversion device.
Figure 1B:
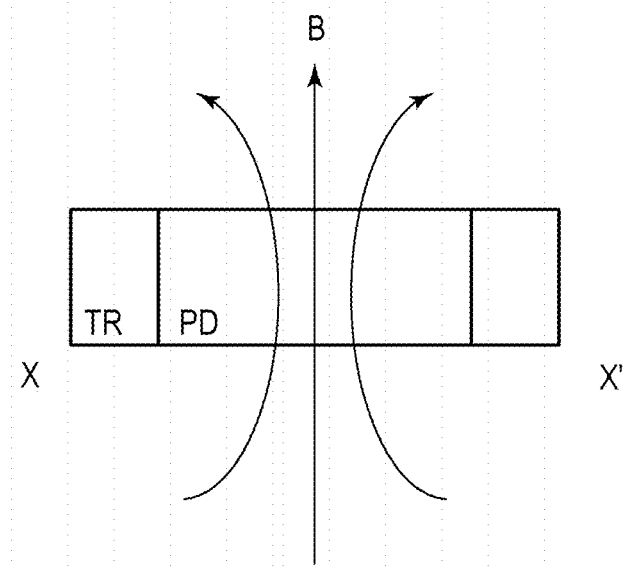

First, an example of the principle of generation electromagnetic radiation in a photoelectric conversion device will be described with reference to FIG. 1A and FIG. 1B. FIG. 1A schematically illustrates a plane of the photoelectric conversion device, and FIG. 1B schematically illustrates a cross-section taken along the line X-X' of the photoelectric conversion device illustrated in FIG. 1A. The photoelectric conversion device illustrated in FIG. 1A and FIG. 1B has an imaging region PD in which a photoelectric conversion unit is arranged and a peripheral circuit region TR in which a peripheral circuit for controlling the photoelectric conversion unit is arranged.

When the photoelectric conversion device is driven, a loop current I circulating around the imaging region PD flows in the peripheral circuit region TR, as illustrated in FIG. 1A. As a result, in the imaging region PD, a magnetic field B perpendicular to the plane thereof occurs. Such the magnetic field B is likely to cause an electromagnetic disturbance such as radio-frequency interference or abnormal resonance.

Although an example in which the peripheral circuit region TR is provided to surround the entire semiconductor chip is illustrated in FIG. 1A for clear illustration, the magnetic field B due to the loop current I occurs in a portion where circuits are concentrated, even with a different layout from FIG. 1A. In particular, when a drive current changes at a high frequency, electromagnetic radiation due to the loop current I will be significant. Thus, the present invention is intended to provide a photoelectric conversion device which can reduce an infrared ray reflected by a magnetic layer while reducing such electromagnetic radiation at a magnetic layer.

Preferred embodiments of the present invention will now be described in detail in accordance with the accompanying drawings. In the drawings, the same reference symbol is provided to the same members or the same components, and the duplicated description thereof will be omitted in the following embodiments.

First Embodiment

Figure 2A:
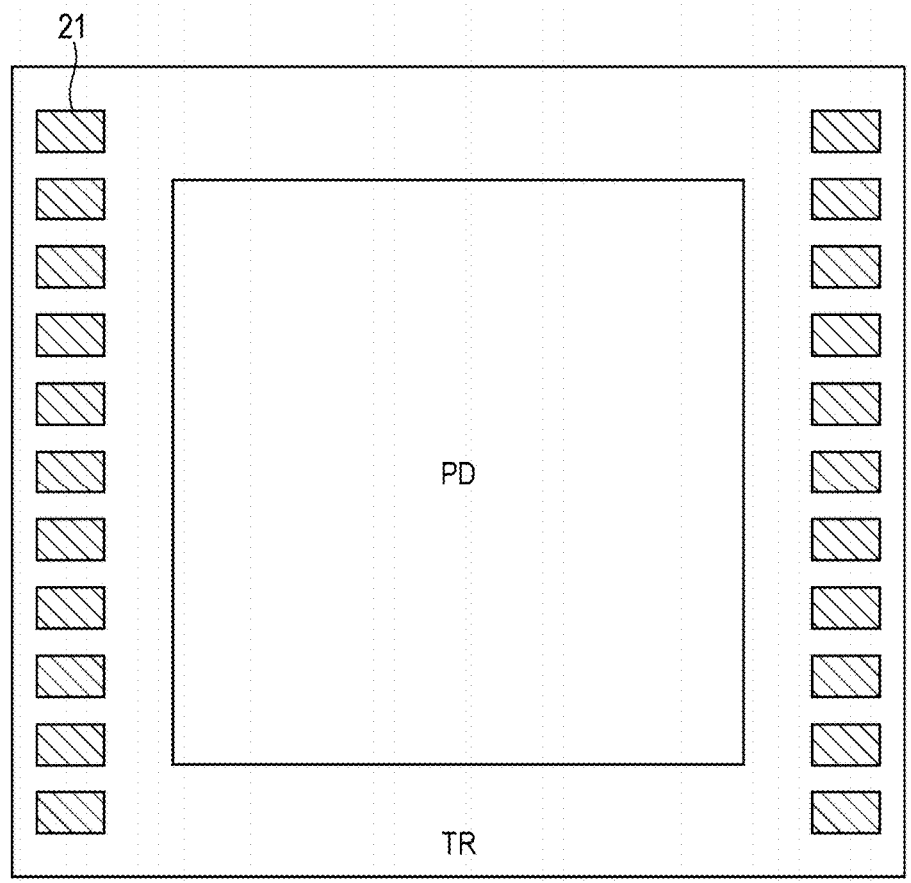
FIG. 2A and FIG. 2B are diagrams schematically illustrating the structure of a photoelectric conversion device according to a first embodiment of the present invention.
Figure 2B:
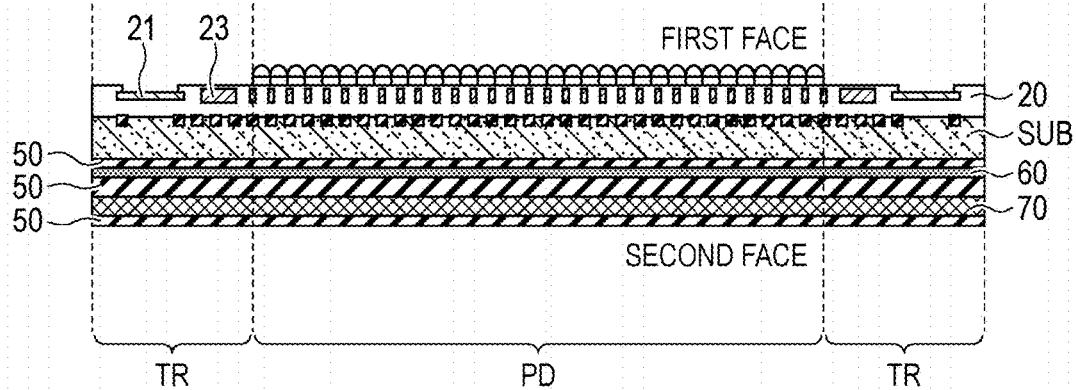

FIG. 2A and FIG. 2B are diagrams schematically illustrating the structure of a photoelectric conversion device according to a first embodiment of the present invention. FIG. 2A schematically illustrates a plane of the photoelectric conversion device of the present embodiment, and FIG. 2B schematically illustrates a cross section of the photoelectric conversion device of the present embodiment. The photoelectric conversion device of the present embodiment has an imaging region PD in which a photoelectric conversion unit (not illustrated) is arranged and a peripheral circuit region TR in which a peripheral circuit (not illustrated) for controlling the photoelectric conversion unit is arranged.

An insulating layer 20 including a plurality of interlayer insulating films is formed on the entire first face of a semiconductor substrate SUB on which the photoelectric conversion unit is arranged. Note that each interlayer insulating film is not illustrated in FIG. 2B. Interconnection layers 23 are each arranged between the plurality of interlayer insulating films of the insulating layer 20 to form multi-level interconnection structure. A light-receiving face of the photoelectric conversion unit is formed via the insulating layer 20 on the first face of the semiconductor substrate SUB in the imaging region PD. A color filter for spectrally diffracting a light or a micro lens for converging a light is arranged on the light-receiving face. Further, electrode pads 21 are arranged in the insulating layer 20 in the peripheral circuit region TR, and the insulating layer 20 is opened on the first face side of the electrode pads 21.

A plurality of insulating layers 50 for maintaining an insulation of the semiconductor substrate SUB are formed on the second face of the semiconductor substrate SUB. An infrared ray absorbing layer 60 and a magnetic layer 70 are arranged between the plurality of insulating layers 50. The present embodiment is featured in that the infrared ray absorbing layer 60 is arranged between the semiconductor substrate SUB and the magnetic layer 70. While it is desirable for the infrared ray absorbing layer 60 to be arranged so as to cover the entire face on the second face side of the semiconductor substrate SUB, the arrangement is not limited thereto. Any arrangement is possible as long as the infrared ray absorbing layer 60 is arranged so as to cover at least the photoelectric conversion unit in the imaging region PD.

While the insulating layer 50 between the infrared ray absorbing layer 60 and the magnetic layer 70 may not necessarily be provided, reflection of an infrared ray at the interface between the infrared ray absorbing layer 60 and the magnetic layer 70 is suppressed by providing the insulating layer 50 in the present embodiment. Further, with the insulating layer 50 being provided, even when an infrared ray is reflected by the magnetic layer 70, the infrared ray can be attenuated by repetition of reflection between the upper face and the under face of the insulating layer 50.

For the insulating layer 20, a material whose primary component is silicon oxide is typically used and, in addition or alternatively, silicon carbide, silicon nitride, or the like may be used. The magnetic layer 70 is formed containing a magnetic substance whose primary component is at least one of sendust, permalloy, ferrite, nickel, or the like, for example. Further, the infrared ray absorbing layer 60 is formed containing an infrared ray absorbing substance whose primary component is at least one of lanthanum hexaboride ($LaB_6$), cesium tungsten oxide (CWO), indium tin oxide (ITO), antimony tin oxide (ATO), or the like. The infrared ray absorbing layer 60 may be a resin containing the above infrared ray absorbing substance, which may be, for example, a resin material such as polyimide kneaded with ITO.

As discussed above, in the present embodiment, the magnetic layer 70 is arranged over the second face side opposite to the light-receiving face of the semiconductor substrate SUB to reduce electromagnetic radiation caused by a current flowing in the peripheral circuit region TR. Furthermore, in the present embodiment, the infrared ray absorbing layer 60 is arranged between the semiconductor substrate SUB on which the photoelectric conversion unit is arranged and the magnetic layer 70, which can also reduce the infrared ray reflected by the magnetic layer 70. In particular, in the configuration of the present embodiment illustrated in FIG. 2B, since the infrared ray reflected by the magnetic layer 70 travels back and forth inside the infrared ray absorbing layer 60 before and after the reflection of the magnetic layer 70, an infrared ray reflected by the magnetic layer 70 can be effectively absorbed.

A method of manufacturing the photoelectric conversion device according to the first embodiment of the present invention will be described below with reference to FIG. 3A to FIG. 3G. FIG. 3A to FIG. 3G schematically illustrate respective steps of the method of manufacturing the photoelectric conversion device of the present embodiment illustrated in FIG. 2A and FIG. 2B. In respective steps, some known semiconductor manufacturing process may be used if necessary, and a heat treatment, a cleaning process, or the like may be performed if necessary between respective steps.

Figure 3A:
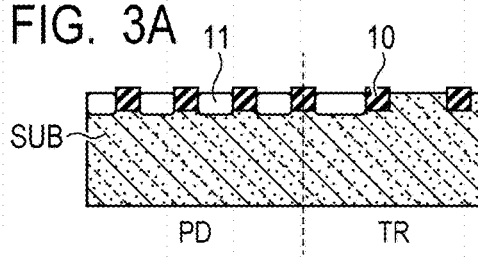
FIG. 3A, FIG. 3B, FIG. 3C, FIG. 3D, FIG. 3E, FIG. 3F and FIG. 3G are diagrams schematically illustrating a method of manufacturing a photoelectric conversion device according to the first embodiment of the present invention.

In the step illustrated in FIG. 3A, the semiconductor substrate SUB is prepared, a photoelectric conversion unit 11 is formed thereon (on the first face side, the same applies hereinafter) in the imaging region PD, and a peripheral circuit (not illustrated) is formed thereon in the peripheral circuit region TR. Note that an element isolation portion 10 such as Shallow Trench Isolation (STI) may be formed in the semiconductor substrate SUB. Each element including a MOS transistor or the like in the imaging region PD and the peripheral circuit region TR can be electrically isolated from another element by the element isolation portion 10.

Figure 3E:
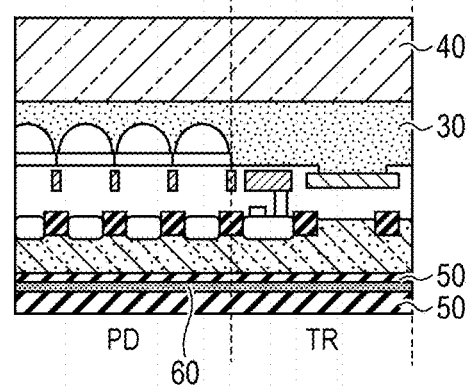
Figure 3B:
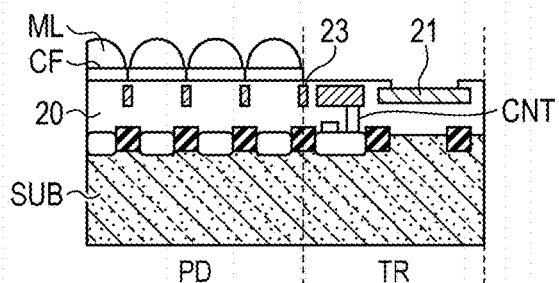

In the step illustrated in FIG. 3B, the insulating layer 20 formed of a plurality of interlayer insulating films is formed on the semiconductor substrate SUB on which the photoelectric conversion unit 11 and the peripheral circuit have been formed. At this time, respective conductive members such as the interconnection layer 23, the electrode pad 21, and a contact plug CNT are formed between the interlayer insulating films of the insulating layer 20. The contact plug CNT electrically connects the photoelectric conversion unit 11 and the peripheral circuit to the interconnection layer 23. For the insulating layer 20, silicon oxide, silicon nitride, silicon oxynitride, or the like may be used.

In the present embodiment, first, a borophosphosilicate glass (BPSG) film is formed as one of the interlayer insulating films of the insulating layer 20 by using a sub-atmospheric CVD method. Next, respective conductive members such as the interconnection layer 23, the electrode pad 21, and the contact plug CNT, in which a conductive material such as tungsten is embedded, are formed on the interlayer insulating film. Next, after a silicon oxide film (not illustrated) is formed as another interlayer insulating film of the insulating layer 20 on the interconnection layer 23 by using a plasma CVD method, a color filter CF for spectral diffraction and a micro lens ML for light convergence are formed above the photoelectric conversion unit 11. Finally, an interlayer insulating film above the electrode pad 21 is opened by using a step such as photolithography, etching, or the like.

Figure 3F:
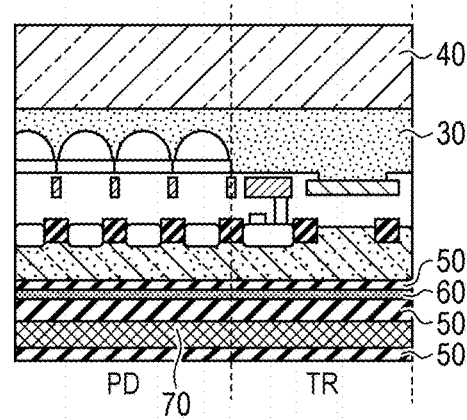
Figure 3C:
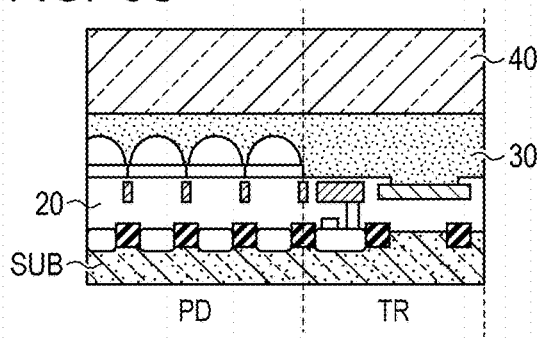

In the step illustrated in FIG. 3C, an adhesion layer 30 is formed over the insulating layer 20, and a support substrate 40 such as a transparent plate is attached thereon. Then, the semiconductor substrate SUB may be thinned by using a back grind process or the like if necessary. In the present embodiment, a quartz glass with a thickness of 0.5 mm as the support substrate 40 is attached to the semiconductor substrate SUB by the adhesion layer 30 that is removable by UV irradiation. Then, the semiconductor substrate SUB is thinned to a thickness of 0.5 mm or less by using a back grind process. For example, even when the semiconductor substrate SUB is thinned to a thickness of 0.3 mm, self-holding is possible even after the support substrate 40 is removed.

In the step illustrated in FIG. 3D, one of the plurality of insulating layers 50 is formed on the entire face under (on the second face side, the same applies hereinafter) the semiconductor substrate SUB. For the insulating layer 50, an insulating material such as silicon oxide or silicon nitride can be used. In the present embodiment, the insulating layer 50 is formed by depositing silicon oxide with a thickness of 1.5 µm on the second face of the semiconductor substrate SUB by using a plasma CVD method.

In the step illustrated in FIG. 3E, a member containing an infrared ray absorbing substance is applied on the entire face under the insulating layer 50 to form the infrared ray absorbing layer 60. Then, another insulating layer 50 is formed on the entire face under the infrared ray absorbing layer 60.

For the infrared ray absorbing layer 60, other than the infrared ray absorbing substance such as lanthanum hexaboride (LaB$_6$), cesium tungsten oxide (CWO), indium tin oxide (ITO), antimony tin oxide (ATO), or the like, a resin containing these infrared ray absorbing substances may be used. In such a resin material, it is possible not only to contain the infrared ray absorbing substance therein but also to control the refractive index thereof. For example, the difference between the refractive index of the infrared ray absorbing layer 60 and the refractive index of the insulating layer 50 may be smaller than the difference between the refractive index of the semiconductor substrate SUB and the refractive index of the insulating layer 50. This can suppress reflection of an infrared ray at the interface between the insulating layer 50 and the infrared ray absorbing layer 60 to further reduce the influence of the infrared ray reflection on an image noise. In this case, it is more preferable that the refractive index of the infrared ray absorbing layer 60 be substantially the same of the refractive index of the insulating layer 50. Further, when a resin material of the infrared ray absorbing layer 60 is photosensitive, pattern formation by using lithography technology such as photoresist will be possible.

While a polyimide resin in which ITO is kneaded in an infrared ray absorbing substance is used in terms of handling easiness and a refractive index of a deposited film and the infrared ray absorbing layer 60 is formed by using a lithography technology such as a coating, exposure, and development process in the present embodiment, the embodiment is not limited thereto. For example, the infrared ray absorbing layer 60 may be formed by using an infrared ray absorbing substance such as ITO, and patterning may be performed by resist work and etching.

In the step illustrated in FIG. 3F, the magnetic layer 70 is formed by a sputtering method or the like on the entire face under the insulating layer 50. Note that, when a greater film thickness of the magnetic layer 70 is preferable, a magnetic material seed layer (not illustrated) may be formed in advance by a sputtering method or the like, and the magnetic layer 70 may be formed by a plating step. Then, another insulating layer 50 is further formed under the magnetic layer 70 as a passivation layer of the semiconductor substrate SUB. Note that, when the magnetic material seed layer is sputtered, a diffusion preventing film such as TiN may be formed in advance to the insulating layer 50 by a sputtering method or the like in order to prevent the magnetic material from diffusing into the semiconductor substrate SUB.

While nickel is used as a magnetic material and deposition is performed by a sputtering method and a plating method in terms of handling easiness and lower diffusion of a metal material at a high temperature in the present embodiment, the embodiment is not limited thereto. For the magnetic material, sendust, permalloy, ferrite, or the like may be used.

Figure 3G:
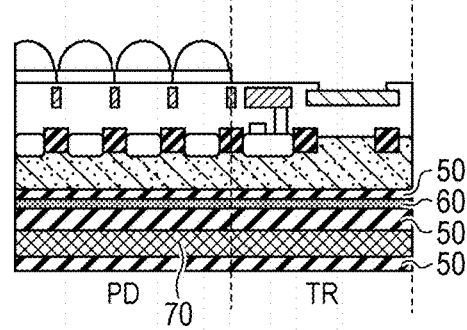
Figure 3D:
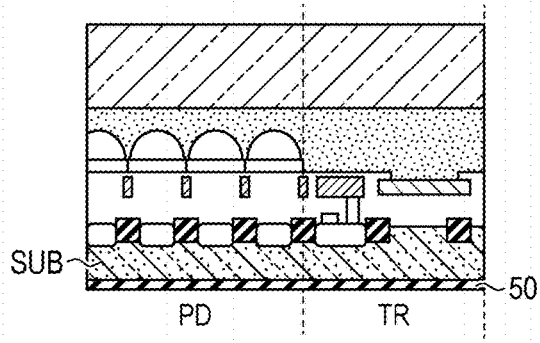

In the step illustrated in FIG. 3G, the support substrate 40 attached in the step illustrated in FIG. 3C is removed by causing the adhesion layer 30 to react with UV irradiation, and the manufacturing of the photoelectric conversion device is completed after a step of dicing or the like.

As described above, the photoelectric conversion device of the present embodiment includes the semiconductor substrate having a light-receiving face of the photoelectric conversion unit on the first face, a magnetic layer arranged on the opposite side to the first face of the semiconductor substrate, and the infrared ray absorbing layer arranged between the semiconductor substrate and the magnetic layer. According to such a configuration, since an infrared ray occurring before and after reflection at the magnetic layer is absorbed in the infrared ray absorbing layer, the infrared ray reflected by the magnetic layer can be further absorbed by the infrared ray absorbing layer while electromagnetic radiation is absorbed by the magnetic layer, so that image noise can be reduced.

Further, according to the configuration of the present embodiment, even when there is an infrared ray which is received in a diagonal direction and cannot be shielded even with an IR filter, the infrared ray can be absorbed by the infrared ray absorbing layer. Therefore, a photoelectric conversion device that can reduce both electromagnetic noise and infrared ray noise can be provided.

Second Embodiment

In the second embodiment of the present invention, a photoelectric conversion device employing the WLCSP structure will be described. The description of the same configuration as in the first embodiment may be omitted.

Figure 4A:
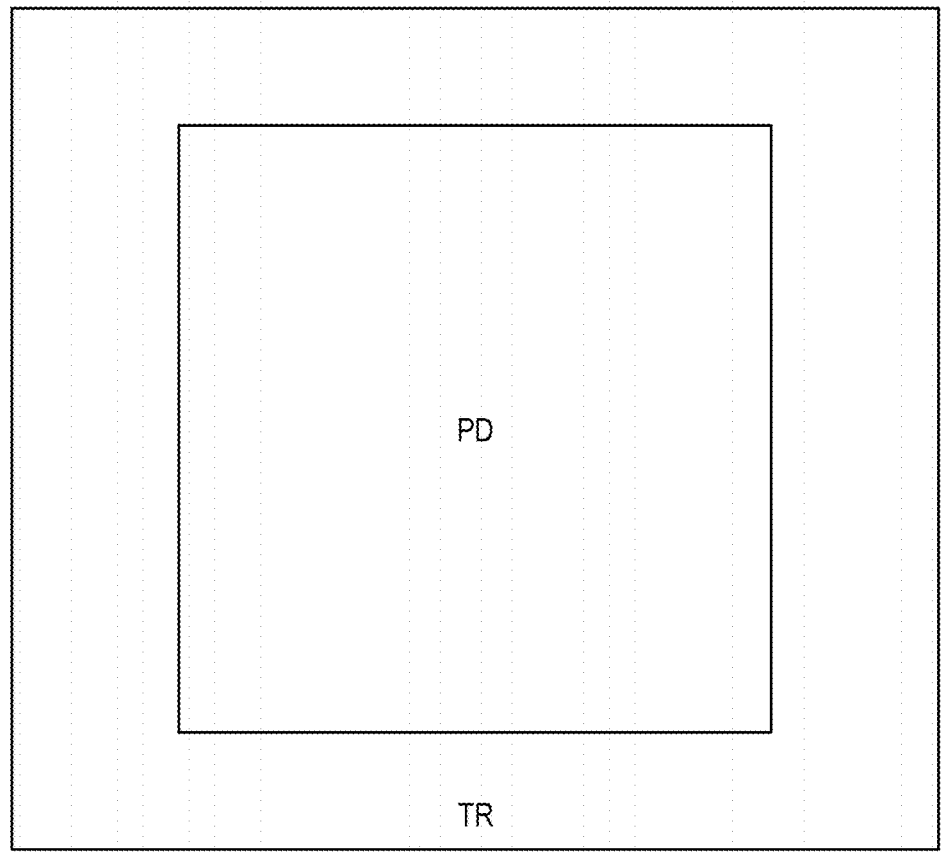
FIG. 4A and FIG. 4B are diagrams schematically illustrating the structure of a photoelectric conversion device according to a second embodiment of the present invention.
Figure 4B:
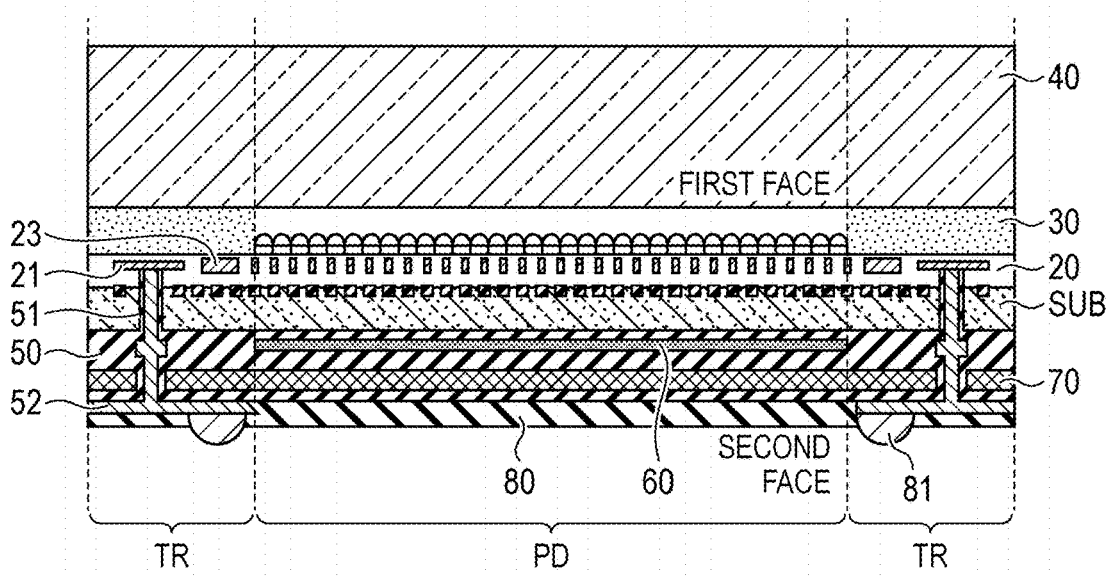

FIG. 4A and FIG. 4B are diagrams schematically illustrating the structure of the photoelectric conversion device according to the second embodiment of the present invention. FIG. 4A schematically illustrates a plane of the photoelectric conversion device of the present embodiment, and FIG. 4B schematically illustrates a cross-section of the photoelectric conversion device according to the present embodiment. The photoelectric conversion device of the present embodiment has the imaging region PD in which the photoelectric conversion unit (not illustrated) is arranged and the peripheral circuit region TR in which a peripheral circuit (not illustrated) for controlling the photoelectric conversion unit is arranged.

The insulating layer 20 including a plurality of interlayer insulating films is formed on the entire first face of the semiconductor substrate SUB on which the photoelectric conversion unit is arranged. Note that each interlayer insulating film is not illustrated in FIG. 4B. Interconnection layers 23 are each arranged between the plurality of interlayer insulating films of the insulating layer 20 to form multi-level interconnection structure. A light-receiving face of the photoelectric conversion unit is formed via the insulating layer 20 on the first face of the semiconductor substrate SUB in the imaging region PD. A color filter for spectrally diffracting a light or a micro lens for converging a light is arranged on the light-receiving face. Further, the electrode pads 21 are arranged in the insulating layer 20 in the peripheral circuit region TR.

The support substrate 40 such as a transparent plate is attached on (on the first face side, the same applies hereinafter) the insulating layer 20 via the adhesion layer 30.

The plurality of insulating layers 50 for maintaining insulation of the semiconductor substrate SUB are formed on the second face of the semiconductor substrate SUB. The infrared ray absorbing layer 60 and the magnetic layer 70 are arranged between the plurality of insulating layers 50. The present embodiment is featured in that the infrared ray absorbing layer 60 is arranged between the semiconductor substrate SUB and the magnetic layer 70. While it is desirable for the infrared ray absorbing layer 60 to be arranged so as to cover the entire face on the second face side of the semiconductor substrate SUB, the arrangement is not limited thereto. Any arrangement is possible as long as the infrared ray absorbing layer 60 is arranged so as to cover at least the photoelectric conversion unit in the imaging region PD.

While the insulating layer 50 between the infrared ray absorbing layer 60 and the magnetic layer 70 may not necessarily be provided, reflection of an infrared ray at the interface between the infrared ray absorbing layer 60 and the magnetic layer 70 is suppressed by providing the insulating layer 50 in the present embodiment. Further, with the insulating layer 50 being provided, even when an infrared ray is reflected by the magnetic layer 70, the infrared ray can be attenuated by repetition of reflection between the upper face and the under face of the insulating layer 50.

An insulating passivation film 80 is provided under (on the second face side, the same applies hereinafter) the plurality of insulating layer 50. A metal interconnection 52 is arranged between the insulating layers 50 and the insulating passivation film 80 in the peripheral circuit region TR, and a solder ball 81 for electrical connection to the outside is formed under the metal interconnection 52. Further, a through electrode 51 penetrating the semiconductor substrate SUB is provided between the metal interconnection 52 and the electrode pad 21. Neither the infrared ray absorbing layer 60 nor the magnetic layer 70 is located around the through electrode 51 in the peripheral circuit region TR, and insulation is ensured by the insulating layers 50 between the infrared ray absorbing layer 60 and the through electrode 51 and between the magnetic layer 70 and the through electrode 51.

For the insulating layer 20, a material whose primary component is silicon oxide is typically used and, in addition or alternatively, silicon carbide, silicon nitride, or the like may be used. The magnetic layer 70 is formed containing a magnetic substance whose primary component is at least one of sendust, permalloy, ferrite, nickel, or the like, for example. Further, the infrared ray absorbing layer 60 is formed containing an infrared ray absorbing substance whose primary component is at least one of lanthanum hexaboride ($LaB_6$), cesium tungsten oxide (CWO), indium tin oxide (ITO), antimony tin oxide (ATO), or the like. The infrared ray absorbing layer 60 may be a resin containing the above infrared ray absorbing substance, which may be, for example, a resin material such as polyimide kneaded with ITO.

As discussed above, in the present embodiment, the magnetic layer 70 is arranged over the second face side opposite to the light-receiving face of the semiconductor substrate SUB to reduce electromagnetic radiation caused by a current flowing in the peripheral circuit region TR. Furthermore, in the present embodiment, the infrared ray absorbing layer 60 is arranged between the semiconductor substrate SUB on which the photoelectric conversion unit is arranged and the magnetic layer 70, which can also reduce an infrared ray reflected by the magnetic layer 70. In particular, in the configuration of the present embodiment illustrated in FIG. 4B, since the infrared ray reflected by the magnetic layer 70 travels back and forth inside the infrared ray absorbing layer 60 before and after the reflection of the magnetic layer 70, the infrared ray reflected by the magnetic layer 70 can be effectively absorbed.

Further, with the infrared ray absorbing layer 60 being provided between the photoelectric conversion unit of the semiconductor substrate SUB and the metal interconnection 52, the infrared ray reflected by the metal interconnection 52 can be absorbed as well.

A method of manufacturing the photoelectric conversion device according to the second embodiment of the present invention will be described below with reference to FIG. 5A to FIG. 5M. FIG. 5A to FIG. 5M schematically illustrate respective steps of the method of manufacturing the photoelectric conversion device of the present embodiment illustrated in FIG. 4A and FIG. 4B. In respective steps, some known semiconductor manufacturing process may be used if necessary, and a heat treatment, a cleaning process, or the like may be performed if necessary between respective steps.

Figure 5A:
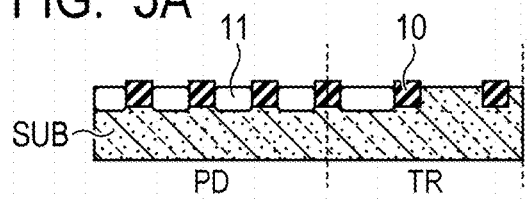
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L and FIG. 5M are diagrams schematically illustrating a method of manufacturing a photoelectric conversion device according to the second embodiment of the present invention.

In the step illustrated in FIG. 5A, the semiconductor substrate SUB is prepared, a photoelectric conversion unit 11 is formed thereon (on the first face side, the same applies hereinafter) in the imaging region PD, and a peripheral circuit (not illustrated) is formed thereon in the peripheral circuit region TR. Note that the element isolation portion 10 such as shallow trench isolation (STI) may be formed in the semiconductor substrate SUB. Each element including a MOS transistor or the like in the imaging region PD and the peripheral circuit region TR can be electrically isolated from another element by the element isolation portion 10.

Figure 5B:
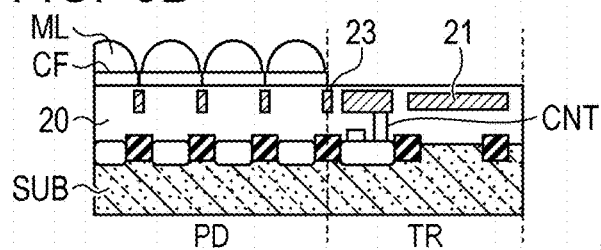

In the step illustrated in FIG. 5B, the insulating layer 20 formed of a plurality of interlayer insulating films is formed on the semiconductor substrate SUB on which the photoelectric conversion unit 11 and the peripheral circuit are formed. At this time, respective conductive members such as the interconnection layer 23, the electrode pad 21, and a contact plug CNT are formed between the interlayer insulating films of the insulating layer 20. The contact plug CNT electrically connects the photoelectric conversion unit 11 and the peripheral circuit to the interconnection layer 23. For the insulating layer 20, silicon oxide, silicon nitride, silicon oxynitride, or the like may be used.

In the present embodiment, first, a borophosphosilicate glass (BPSG) film is formed as one of the interlayer insulating films of the insulating layer 20 by using a sub-atmospheric CVD method. Next, respective conductive members such as the interconnection layer 23, the electrode pad 21, and the contact plug CNT, in which a conductive material such as tungsten is embedded, are formed on the interlayer insulating films. Next, after a silicon oxide film (not illustrated) is formed as another interlayer insulating film of the insulating layer 20 on the interconnection layer 23 by using a plasma CVD method, a color filter CF for spectral diffraction and a micro lens ML for light convergence are formed above the photoelectric conversion unit 11.

In the present embodiment, since the WLCSP structure is employed, the electrode pad 21 is electrically connected to the outside via the through electrode 51 penetrating the semiconductor substrate SUB. Thus, unlike the first embodiment, the insulating layer 20 is not opened above the electrode pad 21. For the purpose of examining characteristics in advance, however, the insulating layer 20 may be opened above the electrode pad 21 in a similar manner to the first embodiment.

Figure 5C:
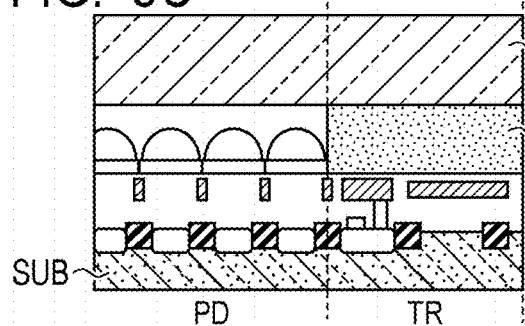

In the step illustrated in FIG. 5C, the adhesion layer 30 is formed over the insulating layer 20, and a support substrate 40 such as a transparent plate is attached thereon. Then, the semiconductor substrate SUB may be thinned by using a back grind process or the like if necessary. In the present embodiment, a quartz glass with a thickness of 0.5 mm as the support substrate 40 is attached to the semiconductor substrate SUB by the adhesion layer 30 that is removable by UV irradiation. Then, the semiconductor substrate SUB is thinned to a thickness of 0.15 mm or less by using a back grind process for easier formation of the through electrode 51 in the subsequent step.

Note that, in FIG. 5C, while the adhesion layer 30 is formed only on the peripheral circuit region TR except the imaging region PD of the semiconductor substrate SUB, the adhesion layer 30 may be formed on the entire face including the imaging region PD of the semiconductor substrate SUB, provided that the adhesion layer 30 has a transparency. In this case, since the semiconductor substrate SUB and the support substrate 40 are adhered and fixed over the entire face, the thickness of the semiconductor substrate SUB can be further reduced by a back grind process or the like. In this case, it is confirmed that there is no problem in reducing the thickness of the semiconductor substrate SUB to around 0.05 mm in the present embodiment.

Figure 5D:
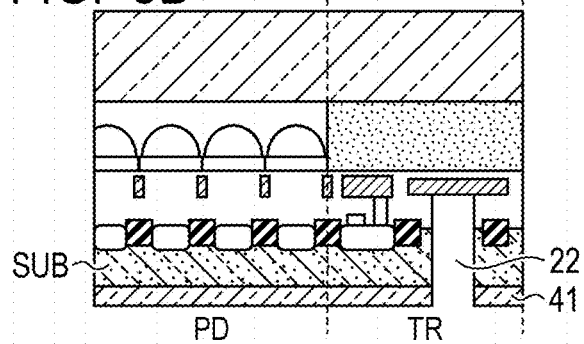

In the step illustrated in FIG. 5D, after a pattern of a first mask 41 is formed under (on the second face side, the same applies hereinafter) the semiconductor substrate SUB, etching is performed from the second face side, and a through via 22 is formed up to the electrode pad 21. Then, the first mask 41 is removed. In the present embodiment, in forming the through via 22, first, the semiconductor substrate SUB is etched using a so-called Bosch process. Subsequently, the insulating layer 20 is etched in an isotropic manner up to the electrode pad 21 using dry etching ($CF_4$, $C_4F_8$, $O_2$, or Ar mixture gas-based capacitive coupled RIE or the like).

Figure 5E:
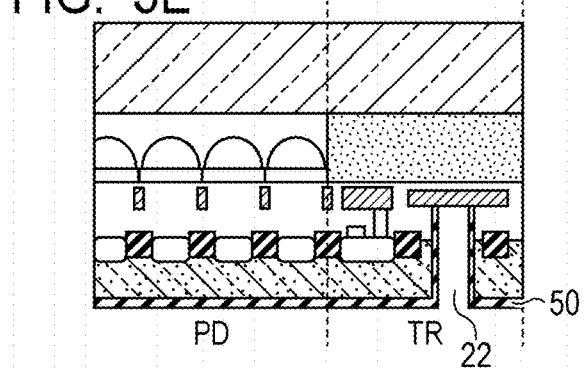

In the step illustrated in FIG. 5E, the insulating layer 50 is formed on the entire face under the semiconductor substrate SUB including the side face of the through via 22. For the insulating layer 50, an insulating material such as silicon oxide or silicon nitride can be used. In the present embodiment, the insulating layer 50 is formed by depositing silicon oxide with a thickness of 1.5 µm on the second face of the semiconductor substrate SUB by using a plasma CVD method. Then, the insulating layer 50 at the bottom of the through via 22 is removed by dry etching ($CF_4$, $C_4F_8$, $O_2$, or Ar mixture gas-based capacitive coupled RIE or the like).

Figure 5F:
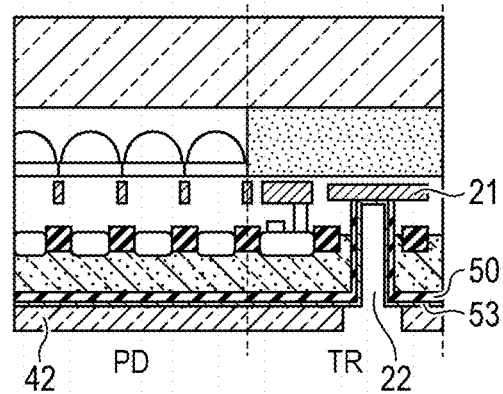

In the step illustrated in FIG. 5F, a metal layer 53 that is utilized as a barrier metal or a seed metal is formed under the insulating layer 50 and the electrode pad 21 by a sputtering method or the like. Then, a second mask 42 is formed in a region except the opening of the through via 22. In the present embodiment, the metal layer 53 is formed by a sputtering method using Ti as a barrier metal and Cu as a seed metal. A use of a resist material as the second mask 42 can simplify the subsequent mask removal step.

Figure 5G:
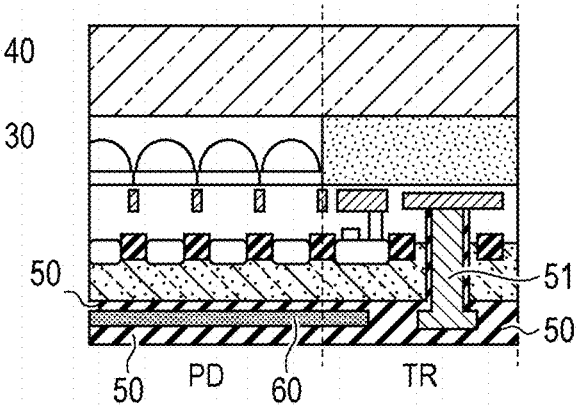

In the step illustrated in FIG. 5G, plating of the patterned metal layer 53 is performed to form the through electrode 51 in the through via 22. Then, the patterned second mask 42 is removed, and the metal layer 53 which has been covered with the second mask 42 and thus has not been plated is removed by a wet etching method or the like.

Subsequently, a member containing an infrared ray absorbing substance is applied under the insulating layer 50 except the peripheral of the through electrode 51 to form the infrared ray absorbing layer 60 at least in the imaging region PD. Then the insulating layer 50 is extended to form the insulating layer 50 so as to vertically interpose the infrared ray absorbing layer 60.

For the infrared ray absorbing layer 60, other than the infrared ray absorbing substance such as lanthanum hexaboride ($LaB_6$), cesium tungsten oxide (CWO), indium tin oxide (ITO), antimony tin oxide (ATO), or the like, a resin containing these infrared ray absorbing substances may be used. In such a resin material, it is possible not only to contain the infrared ray absorbing substance therein but also to control the refractive index thereof. For example, the difference between the refractive index of the infrared ray absorbing layer 60 and the refractive index of the insulating layer 50 may be smaller than the difference between the refractive index of the semiconductor substrate SUB and the refractive index of the insulating layer 50. This can suppress reflection of an infrared ray at the interface between the insulating layer 50 and the infrared ray absorbing layer 60 to further reduce the influence of the infrared ray reflection on an image noise. In this case, it is more preferable that the refractive index of the infrared ray absorbing layer 60 be substantially the same of the refractive index of the insulating layer 50. Further, when a resin material of the infrared ray absorbing layer 60 is photosensitive, pattern formation by using lithography technology such as photoresist will be possible.

While a polyimide resin in which ITO is kneaded in an infrared ray absorbing substance is used in terms of handling easiness and a refractive index of a deposited film and the infrared ray absorbing layer 60 is formed by using a lithography technology such as a coating, exposure, and development process in the present embodiment, the embodiment is not limited thereto. For example, the infrared ray absorbing layer 60 may be formed by using an infrared ray absorbing substance such as TIO, and patterning may be performed by resist work and etching.

Figure 5H:
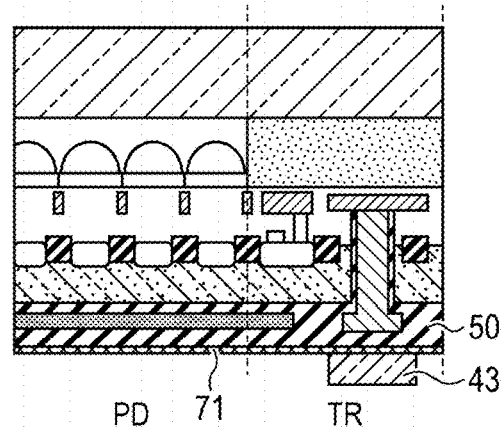

In the step illustrated in FIG. 5H, a magnetic material seed layer 71 is formed on the entire face under the insulating layer 50 by a sputtering method or the like. Then, a third mask 43 is formed in a region of the magnetic material seed layer 71 under the through electrode 51. Thereby, in the subsequent plating step, while the magnetic layer 70 can be formed in the required region, no plating can be formed in a region on which the third mask 43 is formed under the through electrode 51. Note that, when the magnetic material seed layer 71 is sputtered, a diffusion preventing film such as TiN may be formed in advance to the insulating layer 50 by a sputtering method or the like in order to prevent the magnetic material from diffusing into the semiconductor substrate SUB.

While nickel is used as a magnetic material and deposition is performed by a sputtering method and a plating method in terms of handling easiness and lower diffusion of a metal material at a high temperature in the present embodiment, the embodiment is not limited thereto. For the magnetic material, sendust, permalloy, ferrite, or the like may be used. Further, while a resist is used as the third mask 43 to facilitate removal of the third mask 43 in the subsequent step in the present embodiment, an insulating material such as silicon oxide may be used as the third mask 43.

Figure 5I:
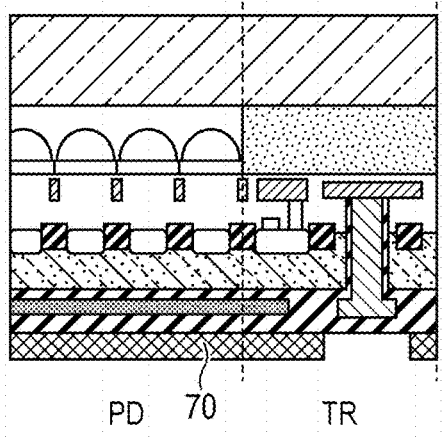

In the step illustrated in FIG. 5I, the magnetic layer 70 is formed in the patterned magnetic material seed layer 71 by a plating step. Then, the third mask 43 is removed, and the magnetic material seed layer 71 covered with the third mask 43 is etched to provide an opening in a region under the thorough electrode 51.

Figure 5L:
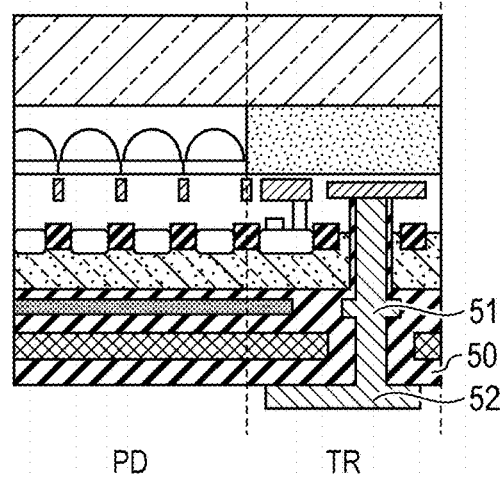
Figure 5J:
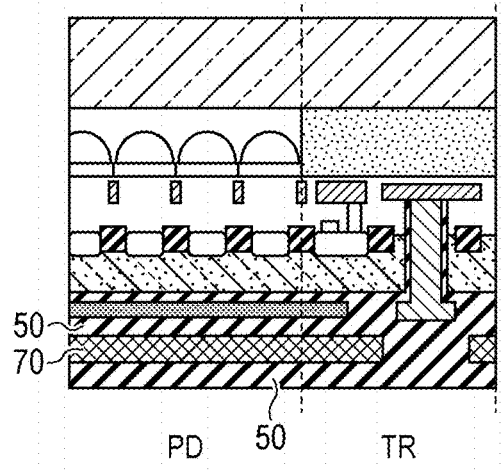

In the step illustrated in FIG. 5J, another insulating layer 50 is formed on the entire face under the magnetic layer 70 including the opening under the through electrode 51. Thereby, insulation between the metal interconnection 52 formed under the insulating layer 50 in the subsequent step and the magnetic layer 70 and between the through electrode 51 and the magnetic layer 70 is ensured in the subsequent step.

Figure 5M:
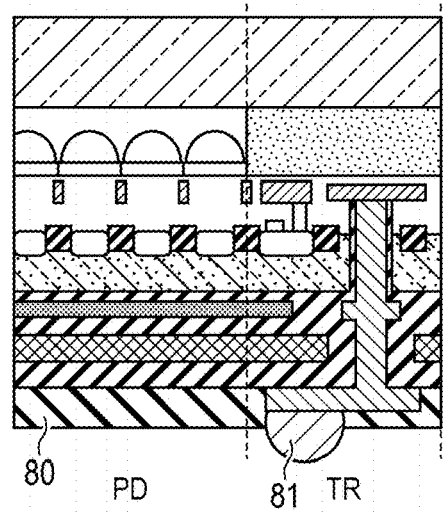
Figure 5K:
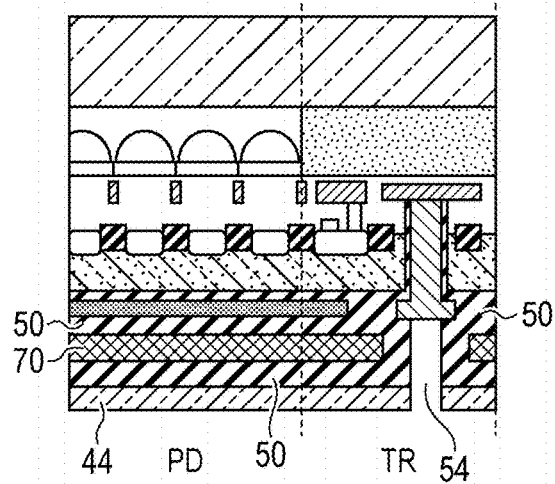

In the step illustrated in FIG. 5K, a fourth mask 44 is patterned under the insulating layer 50 except under the through electrode 51, and a through via 54 is formed in a region under the through electrode 51.

In the step illustrated in FIG. 5L, in a similar manner to the steps illustrated in FIG. 5F and FIG. 5G, the through electrode 51 is extended by performing deposition, patterning, plating, and wet etching on the metal layer. Then, the metal interconnection 52 connected to the through electrode 51 is formed under the insulating layer 50. As discussed above, the insulating layer 50 and the metal interconnection 52 are formed under the magnetic layer 70, so that the infrared ray reflected by the metal interconnection 52 can be absorbed by the infrared ray absorbing layer 60, and image noise can be reduced.

In the present embodiment, the through electrode 51 is formed by two steps as described above taking into consideration of the embedding property of the metal seed layer inside the hole of the through electrode 51, handling easiness, and stability of the steps. In this example, while the pad at a joint of the through electrode 51 is formed with a larger diameter than that of the through electrode 51 in the step of FIG. 5G, the pad at the joint may not be provided. Further, instead of forming the through via 22 as illustrated in the step of FIG. 5D, the plurality of insulating layers 50, the infrared ray absorbing layer 60, and the magnetic layer 70 may be stacked and then the through via 22 (and the through via 54) may be formed penetrating them at once up to the electrode pad 21. In this case, after a metal seed layer is formed by a sputtering method, the through electrode 51 and the metal interconnection 52 are formed by a plating step.

In the process illustrated in FIG. 5M, the insulating passivation film 80 is formed using a photosensitive resin material and then the solder ball 81 is placed by a known semiconductor manufacturing process. After a step of dicing or the like is performed along a scribe line, the manufacturing of the photoelectric conversion device is completed.

As described above, in the photoelectric conversion device of the present embodiment, an insulating layer and a metal interconnection are arranged in this order on the opposite side to a semiconductor substrate of the magnetic layer, and the metal interconnection is connected to a through electrode. Further, an infrared ray absorbing layer is arranged between the semiconductor substrate and the metal interconnection. According to such a configuration, in addition to the same advantages as the first embodiment, such an advantage can be obtained that the infrared ray reflected by the metal interconnection can also be absorbed by the infrared ray absorbing layer. Further, since the WLCSP structure is employed in the present embodiment, a mounting step after dicing can be omitted, which allow for cost reduction of the photoelectric conversion device.

Third Embodiment

In the third embodiment of the present invention, a photoelectric conversion device which employs the backside irradiation structure will be described. The description of the same configuration as in the first embodiment may be omitted.

Figure 6A:
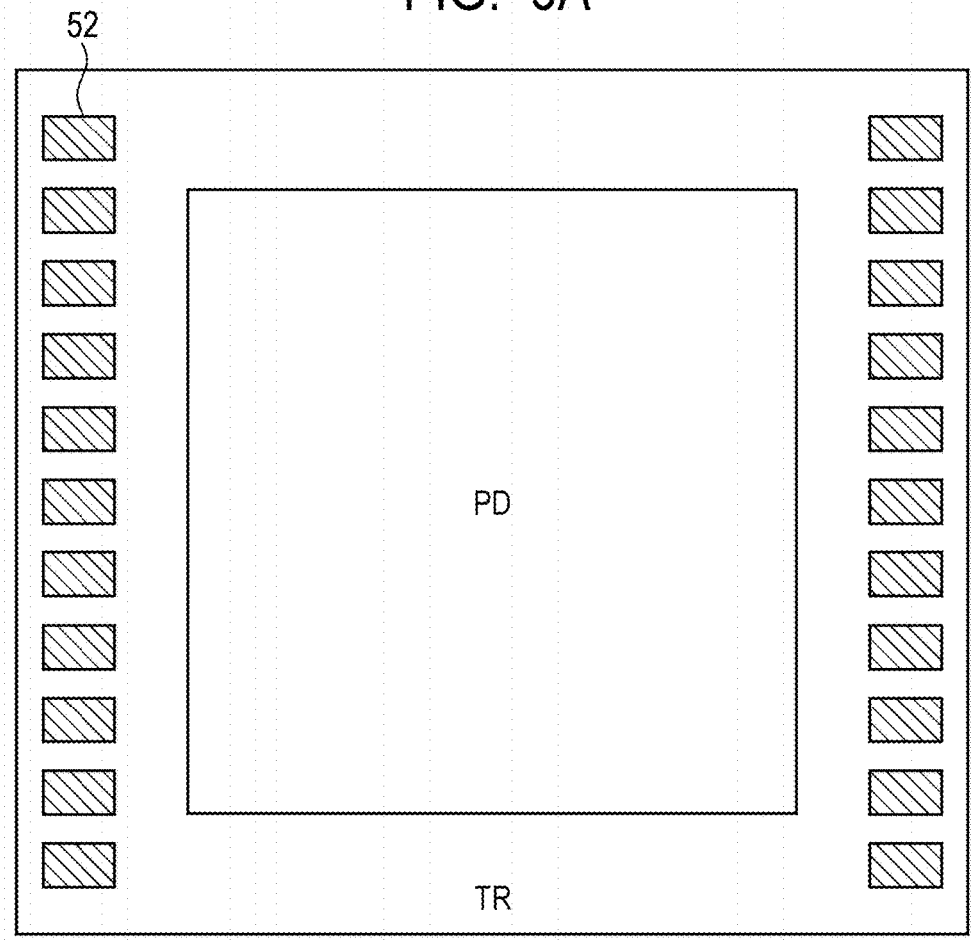
FIG. 6A and FIG. 6B are diagrams schematically illustrating the structure of a photoelectric conversion device according to a third embodiment of the present invention.
Figure 6B:
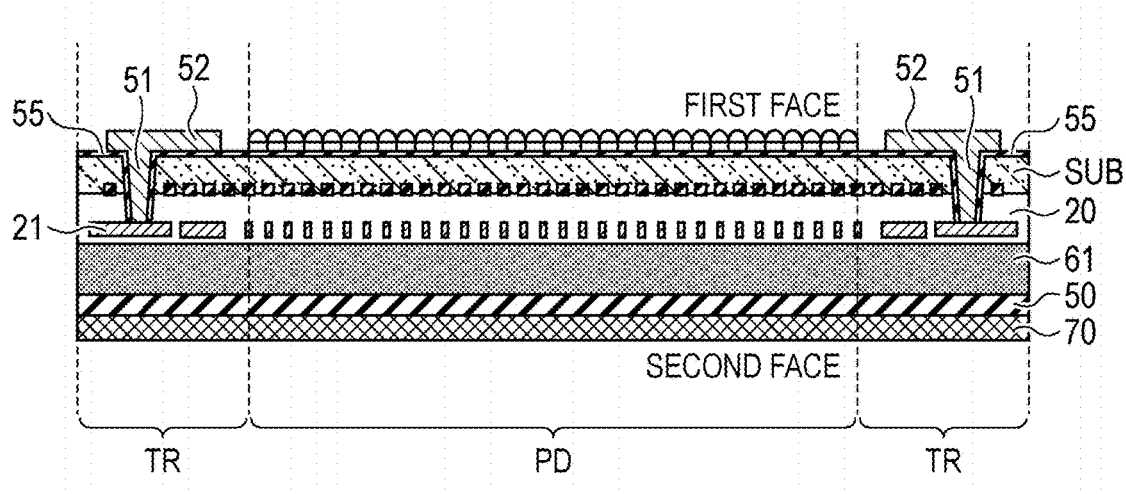

FIG. 6A and FIG. 6B are diagrams schematically illustrating the structure of the photoelectric conversion device according to the third embodiment of the present invention. FIG. 6A schematically illustrates a plane of the photoelectric conversion device of the present embodiment, and FIG. 6B schematically illustrates a cross-section of the photoelectric conversion device according to the present embodiment. The photoelectric conversion device of the present embodiment has the imaging region PD in which the photoelectric conversion unit (not illustrated) is arranged and the peripheral circuit region TR in which a peripheral circuit (not illustrated) for controlling the photoelectric conversion unit is arranged.

The photoelectric conversion device of the present embodiment illustrated in FIG. 6A and FIG. 6B is different from the first embodiment and the second embodiment described above mainly in that the backside irradiation structure is employed. In FIG. 6A and FIG. 6B, the second face side on which the photoelectric conversion unit is arranged is the front face of the semiconductor substrate SUB, and the first face side of the semiconductor substrate SUB having the light-receiving face is the back face thereof. The semiconductor substrate SUB in the backside irradiation structure is significantly thin, and the thickness of the semiconductor substrate SUB is, for example, greater than or equal to 1 μm and less than or equal to 10 μm. Thus, a support substrate is provided to the first face side and/or the second face side of the semiconductor substrate SUB.

The photoelectric conversion unit (not illustrated) is arranged under (on the second face side, the same applies hereinafter) the semiconductor substrate SUB. Further, the insulating layer 20 made of a plurality of interlayer insulating films is formed on the entire face under the semiconductor substrate SUB on which the photoelectric conversion unit is arranged. Note that each interlayer insulating film is not depicted in FIG. 6B. Interconnection layers (not illustrated) are each arranged between the plurality of interlayer insulating films of the insulating layer 20 to form the multi-level interconnection structure.

The insulating film 55 is formed on (on the first face side, the same applies hereinafter) the semiconductor substrate SUB in the imaging region PD in order to protect the photodiode surface, and the color filter CF and the micro lens ML are further arranged via the insulating film 55 for each pixel. Further, the electrode pad 21 is arranged in the insulating layer 20 in the peripheral circuit region TR.

Also in the photoelectric conversion device employing the backside irradiation structure, it is necessary to provide the magnetic layer 70 on the second face side opposite to the light-receiving face of the semiconductor substrate SUB in order to reducing influence of the electromagnetic radiation emitted by the active circuit. Further, in the backside irradiation structure, it is necessary to reduce the film thickness of a silicon of the semiconductor substrate SUB so as not to cause attenuation of a light passing through the semiconductor substrate SUB. However, there is a concern that an infrared ray that has transmitted through the semiconductor substrate SUB is reflected by the magnetic layer 70, which is provided for reducing electromagnetic noise, and again absorbed by the photodiode causing an image noise.

Thus, in the present embodiment, an infrared ray absorbing layer 61 also serves as a support substrate is attached via the insulating layer 20 under the semiconductor substrate SUB on which the photoelectric conversion unit is arranged. The infrared ray absorbing layer 61 that also serves as the support substrate is a silicon substrate, for example.

That is, also in the present embodiment, the infrared ray absorbing layer 61 is arranged between the semiconductor substrate SUB and the magnetic layer 70 in a similar manner to the first embodiment and the second embodiment described above. While it is desirable for the infrared ray absorbing layer 61 to be arranged so as to cover the entire face of the second farce side of the semiconductor substrate SUB, the embodiment is not limited thereto. Any arrangement is possible as long as the infrared ray absorbing layer 61 is arranged so as to cover at least the photoelectric conversion unit in the imaging region PD. While the insulating layer 50 between the infrared ray absorbing layer 61 and the magnetic layer 70 may not be necessarily provided, the insulating layer 50 is provided in the present embodiment in order to prevent diffusion of a metal into the infrared ray absorbing layer 61 that also serves as the support substrate.

The metal interconnection 52 is arranged via the insulating film 55 above the semiconductor substrate SUB in the peripheral circuit region TR. The metal wring 52 also serves as an electrode to be electrically connected to the outside. The through electrode 51 penetrating the semiconductor substrate SUB is provided between the metal interconnection 52 and the electrode pad 21. Insulation is ensured by the insulating film 55 between the semiconductor substrate SUB and the through electrode 51.

For the insulating layer 20, a material whose primary component is silicon oxide is typically used and, in addition or alternatively, silicon carbide, silicon nitride, or the like may be used. The magnetic layer 70 is formed containing a magnetic substance whose primary component is at least one of sendust, permalloy, ferrite, nickel, or the like, for example.

For the infrared ray absorbing layer 61 serving as the support substrate, a single crystalline silicon substrate is typically used. The single crystalline silicon absorbs infrared rays of a wavelength below 1100 nm but has a poor capability of absorbing infrared rays of a wavelength above 1100 nm. However, since an image noise may occur due to an infrared ray of a wavelength above 1100 nm caused by ion implantation of an impurity and heat treatment at the photoelectric conversion unit, it is desirable to enhance the capability of absorbing infrared rays of a wavelength above 1100 nm.

Thus, in the present embodiment, a region where the boron concentration is greater than or equal to $4 \times 10^{13}$ atom/cm$^3$ is provided by implanting boron ions into the single crystalline silicon substrate used as the infrared ray absorbing layer 61 and performing heat treatment. This can enhance the capability of absorbing infrared rays of a wavelength above 1100 nm by the infrared ray absorbing layer 61. Other than the above, the capability of absorbing the infrared ray of a wavelength above 1100 nm can be enhanced by implanting carbon or the like into the single crystalline silicon substrate and forming crystal defects or arranging polycrystalline silicon on the support substrate.

The infrared ray absorbing layer 61 that also serves as the support substrate can further serve as a circuit substrate. In this case, circuit wirings are arranged between the insulating layer 20 and the infrared ray absorbing layer 61. In order to prevent reflection of an infrared ray by the circuit wirings, it is desirable that the opening ratio of the circuit wirings in a region overlapping with the photoelectric conversion unit be greater than or equal to 65% in a plan view.

Further, it is desirable that, in the infrared ray absorbing layer 61 that also serves as the circuit substrate, the concentration of boron ion-implanted to a MOS transistor arranged in at least a part of region overlapping with the photoelectric conversion unit in a plan view be greater than or equal to $4 \times 10^{13}$ atom/cm$^3$. This can enhance the capability of absorbing infrared rays of a wavelength above 1100 nm by the infrared ray absorbing layer 61. Then, even when a silicide is formed on the MOS transistor, since an infrared ray transmits through the silicide if the thickness of the silicide is less than or equal to 50 nm, the infrared ray is absorbed by the ion-implanted MOS transistor above the infrared absorbing layer 61.

Further, an infrared ray absorbing layer which absorbs infrared rays of a wavelength above 1100 nm may be provided on the surface of the infrared ray absorbing layer 61. In this case, the infrared ray absorbing layer 61 is formed containing an infrared ray absorbing substance whose primary component is at least one of lanthanum hexaboride (LaB$_6$), cesium tungsten oxide (CWO), indium tin oxide (ITO), antimony tin oxide (ATO), or the like. The infrared ray absorbing layer 61 may be a resin containing the above infrared ray absorbing substance, for example, a resin material such as polyimide kneaded with ITO.

The thickness of the infrared ray absorbing layer 61 that also serves as the support substrate is desirably less than or equal to 0.5 mm, more desirably less than or equal to 0.3 mm through back grind or the like, in order to reduce the distance between the magnetic layer 70 and the photoelectric conversion unit as much as possible to facilitate absorption of the electromagnetic noise. On the other hand, the thickness of the infrared ray absorbing layer 61 that also serves as the support substrate is desirably greater than or equal to 0.05 mm, more desirably greater than or equal to 0.1 mm, in order to ensure the shape support property of the semiconductor chip.

In the configuration of the photoelectric conversion device of the present embodiment illustrated in FIG. 6B, the infrared ray reflected by the magnetic layer 70 will travel back and forth inside the infrared ray absorbing layer 61 that also serves as the support substrate before and after the reflection by the magnetic layer 70. Thus, even when the infrared ray absorbing layer 61 is a silicon layer having a poor capability of absorbing infrared rays of a wavelength above 1100 nm, if the thickness thereof is 0.05 mm or greater, the infrared ray can be sufficiently absorbed by a path of twice the length of the thickness of the infrared ray absorbing layer 61 during traveling back and forth inside the infrared ray absorbing layer 61.

A method of manufacturing the photoelectric conversion device according to the third embodiment of the present invention will be described below with reference to FIG. 7A to FIG. 7H. FIG. 7A to FIG. 7H schematically illustrate respective steps of the method of manufacturing the photoelectric conversion device of the present embodiment illustrated in FIG. 6A and FIG. 6B. In respective steps, some known semiconductor manufacturing process may be used if necessary, and a heat treatment, a cleaning process, or the like may be performed if necessary between respective steps.

Figure 7A:
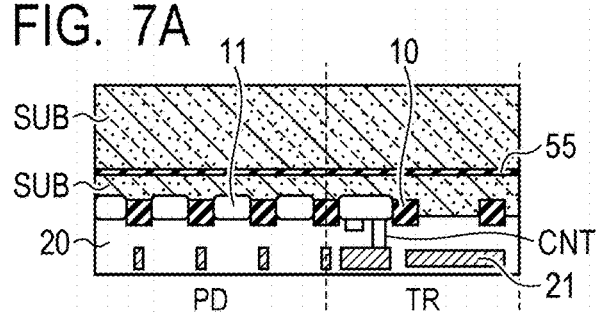
FIG. 7A, FIG. 7B, FIG. 7C, FIG. 7D, FIG. 7E, FIG. 7F, FIG. 7G and FIG. 7H are diagrams schematically illustrating a method of manufacturing a photoelectric conversion device according to the third embodiment of the present invention.

In the step illustrated in FIG. 7A, the semiconductor substrate SUB is prepared, a photoelectric conversion unit 11 is formed under (on the second face side, the same applies hereinafter) the imaging region PD, and a peripheral circuit (not illustrated) is formed under the peripheral circuit region TR. Note that the element isolation portion 10 such as Shallow Trench Isolation (STI) may be formed in the semiconductor substrate SUB. Each element including a MOS transistor or the like in the imaging region PD and the peripheral circuit region TR can be electrically isolated from another element by the element isolation portion 10.

Then, the insulating layer 20 formed of a plurality of interlayer insulating films is formed under the semiconductor substrate SUB on which the photoelectric conversion unit 11 and the peripheral circuit are formed. At this time, respective conductive members such as the electrode pad 21 and a contact plug CNT are formed between the interlayer insulating films of the insulating layer 20. For the insulating layer 20, silicon oxide, silicon nitride, silicon oxynitride, or the like may be used.

In the present embodiment, first, a borophosphosilicate glass (BPSG) film is formed as one of the interlayer insulating films of the insulating layer 20 by using a sub-atmospheric CVD method. Next, conductive members such as the electrode pad 21 and the contact plug CNT, in which a conductive material such as tungsten is embedded, are formed under the interlayer insulating film. Next, a silicon oxide film (not illustrated) is formed as another interlayer insulating film of the insulating layer 20 under the electrode pad 21 by using a plasma CVD method.

While the semiconductor substrate SUB may be a usual silicon wafer, a silicon-on-insulator (SOI) wafer is used in the present embodiment in terms of easier processing in the subsequent steps.

Figure 7B:
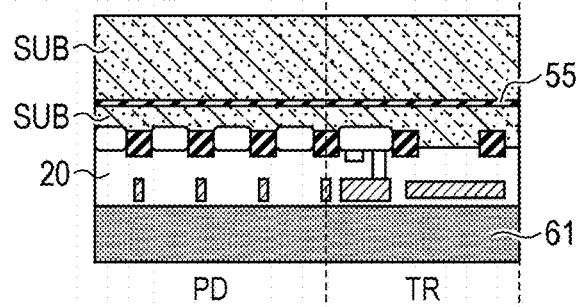

In the step illustrated in FIG. 7B, the infrared ray absorbing layer 61 that also serves as the support substrate is attached to the semiconductor substrate SUB via the insulating layer 20. In the present embodiment, in order to enhance the capability of absorbing the infrared ray having a wavelength of 1100 nm or longer in the infrared ray absorbing layer 61, the infrared ray absorbing layer 61 having an impurity layer is formed by implanting boron of $4 \times 10^{13}$ atom/cm$^3$ or more into the support substrate made of silicon and performing heat treatment. The infrared ray absorbing layer 61 may further serve as a circuit substrate, and in this case, circuit wirings are arranged between the infrared ray absorbing layer 61 and the insulating layer 20. In this case, in order to prevent reflection of an infrared ray from the circuit wiring, it is desirable that the opening ratio of the circuit wiring in a region overlapping with the photoelectric conversion unit 11 be greater than or equal to 65% in a plan view.

Further, in the infrared ray absorbing layer 61 that also serves as the circuit substrate is formed such that the concentration of boron ion-implanted into the MOS transistor arranged in at least a part of a region overlapping with the photoelectric conversion unit 11 in a plan view is greater than or equal to $4 \times 10^{13}$ atom/cm$^3$. This can enhance the capability of absorbing the infrared ray of a wavelength above 1100 nm by the infrared ray absorbing layer 61.

Figure 7C:
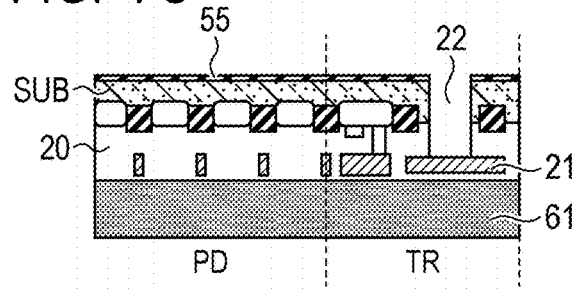

In the step illustrated in FIG. 7C, the semiconductor substrate SUB is thinned by performing a back grind process and a chemical mechanical polishing (CMP) process on the second face side of the semiconductor substrate SUB. In the present embodiment, the semiconductor substrate SUB is thinned by performing a back grind process such that 10 µm to 15 µm of silicon is left on the insulating film 55 of an SOI substrate that is the semiconductor substrate SUB. Then, the semiconductor substrate SUB is thinned to the insulating film 55 in the SOI substrate by a CMP process.

Then, after a fifth mask (not illustrated) is patterned on the semiconductor substrate SUB, the semiconductor substrate SUB is etched from the first face side to form a through via 22 down to the electrode pad 21. In the present embodiment, in forming the through via 22, first, the semiconductor substrate SUB is etched using a so-called Bosch process. Subsequently, the insulating layer 20 is etched in an isotropic manner down to the electrode pad 21 using dry etching ($CF_4$, $C_4F_8$, $O_2$, or Ar mixture gas-based capacitive coupled RIE or the like).

Figure 7D:
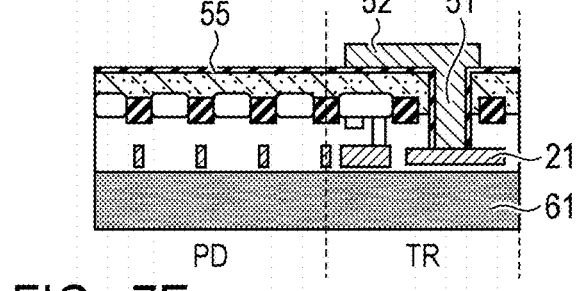

In the step illustrated in FIG. 7D, the insulating film 55 is formed overlapping with the entire face on the semiconductor substrate SUB including the side face of the through via 22. For the insulating film 55, an insulating material such as silicon oxide or silicon nitride can be used. The present embodiment, the silicon oxide of a thickness of 1.5 µm is deposited on the semiconductor substrate SUB by a plasma CVD method.

Then, the insulating film 55 at the bottom of the through via 22 is removed by dry etching ($CF_4$, $C_4F_8$, $O_2$, Ar mixture gas-based capacitive coupled RIE or the like). Subsequently, after a metal layer (not illustrated) as a barrier metal or a seed metal is formed on the insulating film 55 and the electrode pad 21 by a sputtering method or the like, and a sixth mask (not illustrated) that is opened in a region of the through via 22 and the peripheral thereof is formed. In the present embodiment, Ti is used as the barrier metal, and Cu is used as the seed metal. A use of a resist material for the sixth mask can simplify a mask removal step after plating.

Then, the patterned metal layer (not illustrated) is plated to form the through electrode 51 in the through via 22. Then, the patterned sixth mask is removed, and the metal layer 53 that is covered with the sixth mask and thus has not been plated is removed by a wet etching method or the like. Further, the metal interconnection 52 that also serves as an electrode is formed on the second face side of the semiconductor substrate SUB.

Figure 7E:
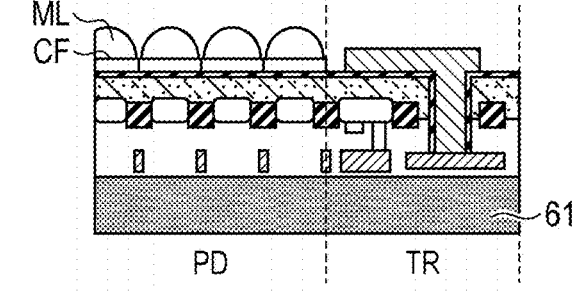

In the step illustrated in FIG. 7E, a color filter CF for spectral diffraction and a micro lens ML for light convergence are formed above the photoelectric conversion unit 11 in the imaging region PD.

Figure 7F:
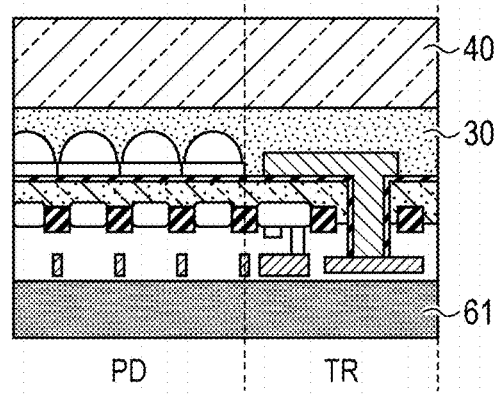

In the step illustrated in FIG. 7F, the support substrate 40 is attached to the semiconductor substrate SUB via the adhesion layer 30 for protection of the first face side. In the present embodiment, a resin solved by an ultraviolet ray irradiation is used as the material of the adhesion layer 30 for subsequent easier removal of the adhesion layer 30 and the support substrate 40.

Figure 7G:
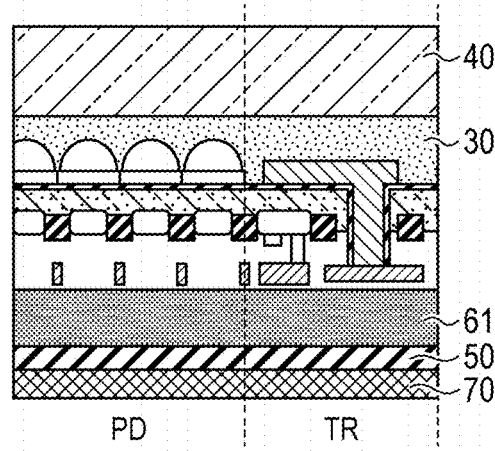

In the step illustrated in FIG. 7G, the insulating layer 50 is formed on the entire face under the infrared ray absorbing layer 61 that also serves as the support substrate. An insulating material such as silicon oxide or silicon nitride can be used for the insulating layer 50. In the present embodiment, the insulating layer 50 is formed by depositing silicon oxide on the semiconductor substrate SUB by a thickness of 1.5 µm using a plasma CVD method.

Then, the magnetic layer 70 is formed on the entire face under the insulating layer 50 by a sputtering method or the like. Note that, when a greater film thickness of the magnetic layer 70 is desirable, a magnetic material seed layer (not illustrated) may be formed in advance by a sputtering method or the like and then the magnetic layer 70 may be formed by a plating step. Then, in the present embodiment, another insulating layer 50 is further formed under the magnetic layer 70 as a passivation film of the semiconductor substrate SUB. Note that, when the magnetic material seed layer is sputtered, a diffusion preventing film such as TiN may be formed in advance to the insulating layer 50 by a sputtering method or the like in order to prevent the magnetic material from diffusing into the semiconductor substrate SUB.

While nickel is used as a magnetic material and deposition is performed by a sputtering method and a plating method in terms of handling easiness and lower diffusion of a metal material at a high temperature in the present embodiment, the embodiment is not limited thereto. For the magnetic material, sendust, permalloy, ferrite, or the like may be used.

Figure 7H:
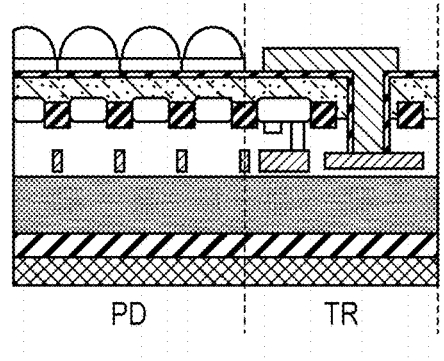

In the step illustrated in FIG. 7H, the support substrate 40 attached in the step illustrated in FIG. 7F is removed by causing the adhesion layer 30 to react with UV irradiation, and the manufacturing of the photoelectric conversion device is completed after a step of dicing or the like.

As discussed above, the photoelectric conversion device of the present embodiment employs the backside irradiation structure. Further, the infrared ray absorbing layer also serves as the support substrate. Also in such a configuration, the same advantages as in the first and second embodiments described above can be obtained.

Further, in the photoelectric conversion device of the present embodiment, the infrared ray absorbing layer can further serve as the circuit substrate. In this case, the concentration of boron ion-implanted into a MOS transistor arranged in at least a part of a region overlapping with the photoelectric conversion unit in a plan view is greater than or equal to $4 \times 10^{13}$ atom/cm$^3$. Thereby, the capability of absorbing infrared rays of a wavelength above 1100 nm can be enhanced by the infrared ray absorbing layer 61.

OTHER EMBODIMENTS

Note that all the above-described embodiments merely illustrate embodied examples in implementing the present invention, and the technical scope of the present invention should not be construed in a limiting sense by these examples. That is, the present invention can be implemented in various forms without departing from its technical idea or its primary feature. For example, the above-described embodiments can be applied in a combination thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-024952, filed Feb. 14, 2017 which is hereby incorporated by reference herein in its entirety.

What is claimed is:

1. A photoelectric conversion device comprising:
    a semiconductor substrate having a photoelectric conversion unit;
    a magnetic layer arranged over an opposite side to a light-receiving face of the semiconductor substrate;
    a silicon substrate arranged between the semiconductor substrate and the magnetic layer;
    a first insulating layer arranged between the silicon substrate and the semiconductor substrate; and
    a second insulating layer arranged between the silicon substrate and the magnetic layer,
    wherein a distance between the magnetic layer and the silicon substrate is smaller than a distance between the semiconductor substrate and the silicon substrate.

2. The photoelectric conversion device according to claim 1, wherein the magnetic layer contains a material whose primary component is at least one of ferrite and nickel.

3. The photoelectric conversion device according to claim 1, further comprising: a support substrate attached to a side of the light-receiving face of the semiconductor substrate.

4. The photoelectric conversion device according to claim 1, wherein a thickness of the silicon substrate is 0.05 mm to 0.5 mm.

5. The photoelectric conversion device according to claim 1, further comprising a through electrode, which penetrates the semiconductor substrate.

6. The photoelectric conversion device according to claim 5, further comprising a pad arranged between the silicon substrate and the semiconductor substrate, wherein the pad is connected to the through electrode.

7. The photoelectric conversion device according to claim 1, wherein a thickness of the semiconductor substrate is 1 µm to 10 µm.

8. The photoelectric conversion device according to claim 1, wherein the photoelectric conversion device employs a chip size package.

9. The photoelectric conversion device according to claim 1, further comprising a film disposed between the semiconductor substrate and the magnetic layer, the film preventing a material in the magnetic layer from diffusing into the semiconductor substrate.

10. The photoelectric conversion device according to claim 9, wherein a thickness of the silicon substrate is 0.1 mm to 0.3 mm.

11. The photoelectric conversion device according to claim 1, wherein a MOS transistor is arranged in at least a part of the silicon substrate, the part overlapping with the photoelectric conversion unit in a plan view.

12. A photoelectric conversion device comprising:
    a semiconductor substrate having a photoelectric conversion unit;
    a magnetic layer arranged over an opposite side to a light-receiving face of the semiconductor substrate; and
    a silicon substrate arranged between the semiconductor substrate and the magnetic layer,
    wherein the silicon substrate is arranged to absorb an infrared ray reflected by the magnetic layer.

13. The photoelectric conversion device according to claim 12, further comprising another layer, which contains a substance whose primary component is at least one of lanthanum hexaboride, cesium tungsten oxide, indium tin oxide, and antimony tin oxide.

14. The photoelectric conversion device according to claim 13, wherein the another layer is a resin containing the substance.

15. The photoelectric conversion device according to claim 12, wherein a circuit wiring is arranged between the silicon substrate and the semiconductor substrate, and an opening ratio of the circuit wiring of a region overlapping with the photoelectric conversion unit in a plan view is greater than or equal to 65%.

16. The photoelectric conversion device according to claim 12, wherein the silicon substrate has a portion in which a concentration of boron is greater than or equal to $4 \times 10^{13}$ atom/cm$^3$ in a region overlapping with the photoelectric conversion unit in a plan view.

17. The photoelectric conversion device according to claim 12, wherein a thickness of the semiconductor substrate is 0.05 mm to 0.5 mm.

18. The photoelectric conversion device according to claim 12, wherein a distance between the magnetic layer and the silicon substrate is smaller than a distance between the semiconductor substrate and the silicon substrate.

19. A photoelectric conversion device comprising:
a semiconductor substrate having a photoelectric conversion unit;
a magnetic layer arranged over an opposite side to a light-receiving face of the semiconductor substrate; and
a silicon substrate arranged between the semiconductor substrate and the magnetic layer,
wherein a MOS transistor is arranged in at least a part of the silicon substrate, the part overlapping with the photoelectric conversion unit in a plan view, and
wherein a silicide is formed on the MOS transistor, and a thickness of the silicide is less than or equal to 50 nm.

20. The photoelectric conversion device according to claim 19, further comprising:
a first insulating layer arranged between the silicon substrate and the semiconductor substrate; and
a second insulating layer arranged between the silicon substrate and the magnetic layer,
wherein a distance between the magnetic layer and the silicon substrate is smaller than a distance between the semiconductor substrate and the silicon substrate.

* * * * *